United States Patent [19]
Barrett

[11] Patent Number: 6,134,512
[45] Date of Patent: *Oct. 17, 2000

[54] SYSTEM AND METHOD FOR REPRESENTING PHYSICAL ENVIRONMENT

[75] Inventor: Geoff Barrett, Bristol, United Kingdom

[73] Assignee: SGS-Thomson Microelectronics Limited, Almondsbury Bristol, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/979,450

[22] Filed: Nov. 24, 1997

[30] Foreign Application Priority Data

Nov. 26, 1996 [GB] United Kingdom .................... 9624935

[51] Int. Cl.$^7$ .............................. G06F 17/50; G06G 7/62
[52] U.S. Cl. .................................. 703/13; 703/23; 700/12; 714/724
[58] Field of Search ........................... 364/578; 395/500; 703/13, 23; 700/12; 716/3, 4, 18; 714/724

[56] References Cited

U.S. PATENT DOCUMENTS

| | | | |
|---|---|---|---|
| 5,258,919 | 11/1993 | Yamanouchi et al. ................ | 364/489 |
| 5,311,521 | 5/1994 | Fitingof et al. ....................... | 371/37.4 |
| 5,331,568 | 7/1994 | Pixley ................................... | 364/489 |
| 5,706,473 | 1/1998 | Yu et al. ............................... | 395/500 |

OTHER PUBLICATIONS

Standard Search Report for Application No. 9624935.4, filed Nov. 29, 1996.
Atsushi Takahara et al., *A Higher Level Hardware Design Verification*, Oct. 3–5, 1988, p. 596–599 IEEE, XP000092906.
Jain P. Et al., *Hierarchical Constraint Solving in the Parameteric Form with Applications to Efficient Symbolic Simulation based Verification*, Oct. 3–6, 1993, pp. 304–307, IEEE XP000463420.
Aziz a. et al., *Minimiying interacting Finite State Machines: A Compositional Approach to Language Containment*, Oct. 10–12, 1994, pp. 255–261, IEEE XP000488900.
Coudert et al., *Verification of Sequential Machines Using Boolean Functional Vectors*, Dec. 13, 1989, pages Int. Workshop on Applied Formal Methods for Correct VLSI Design.

*Primary Examiner*—Kevin J. Teska
*Assistant Examiner*—Samuel Broda
*Attorney, Agent, or Firm*—Wolf, Greenfield & Sacks, P.C.; James H. Morris; Theodore E. Galanthay

[57] ABSTRACT

A system for representing a physical environment comprises a first store for holding a set of state bits, a second store for holding a set of input bits, an input device for inputting a set of initial states of said state bits into said first store, means for implementing a set of state transition functions for manipulating said input bits and said state bits, and means for generating input bits satisfying a set of constrains representing restrictions on the physical environment.

10 Claims, 2 Drawing Sheets

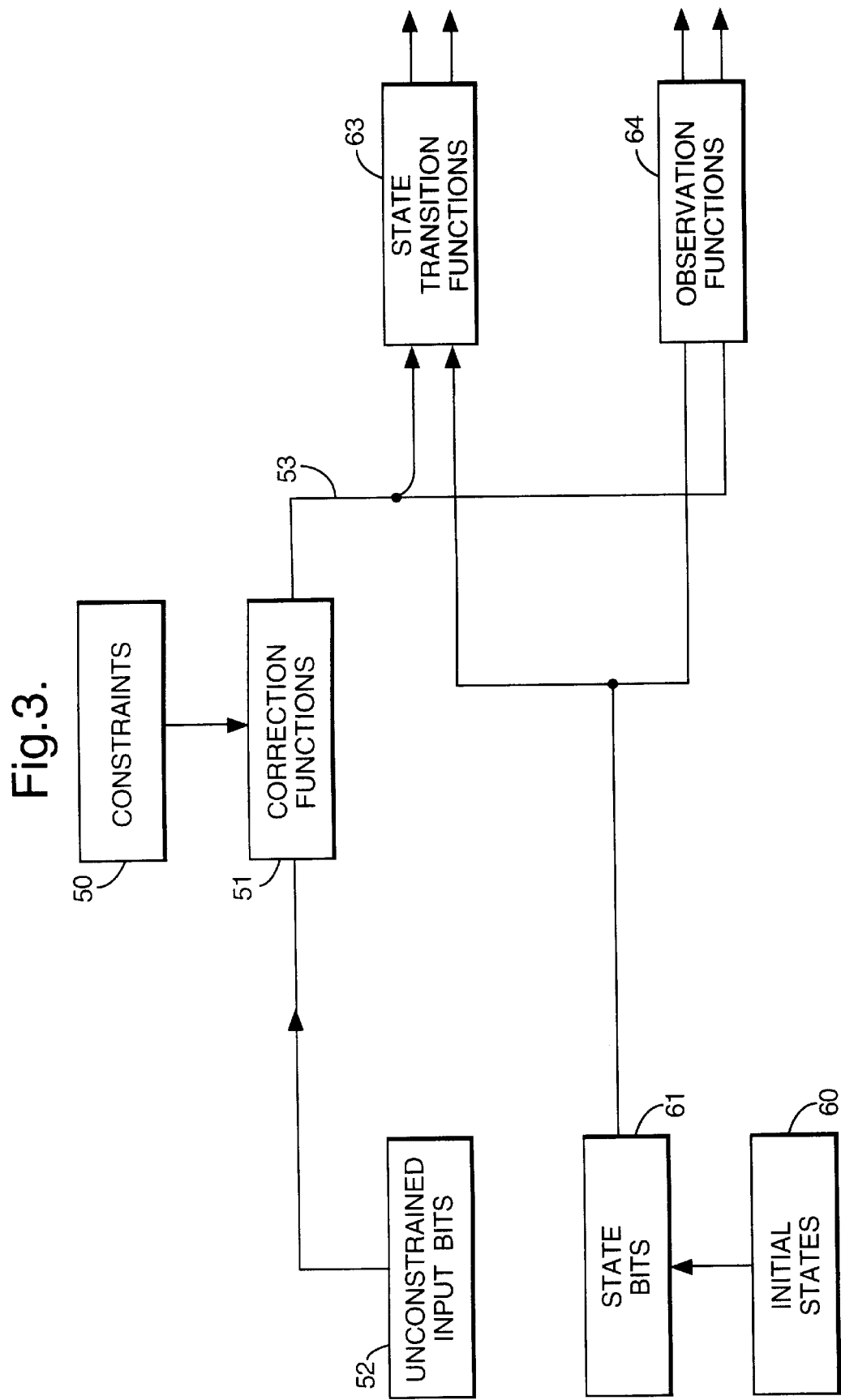

SYSTEM AND METHOD FOR REPRESENTING PHYSICAL ENVIRONMENT

FIELD OF THE INVENTION

The present invention relates to a system for representing or simulating operation of a physical environment, and is applicable to a technique for proving properties of a system, and more especially but not exclusively to a technique for proving properties of a hardware system.

BACKGROUND OF THE INVENTION

Although a hardware system may itself be deterministic such that its behaviour may be determined completely by inputs to the system, the same may not be true of the environment in which the hardware system exists. Typically, the behaviour of the environment is dependent upon such a large number of inputs that it is not possible to provide a deterministic model of the behaviour of the environment which therefore appears to be a non-deterministic system. It is also possible that the environment is mathematically non-deterministic, in the sense that even if all of the inputs could be assessed, the outputs are still not known.

The present invention finds particular application in synthesising the behaviour of hardware systems within their environment for example for the development-testing of a hardware system. It is also possible to apply the invention to modelling the behaviour of software systems for testing purposes.

SUMMARY OF THE INVENTION

According to a first aspect of the present invention there is provided a system for representing a physical environment comprising a first store for holding a set of state bits; a second store for holding a set of input bits; an input device for inputting a set of initial states of said state bits into said first store; means for implementing a set of state transition functions for manipulating said input bits and said state bits; and means for generating input bits satisfying a set of constrains representing restrictions on the physical environment.

According to a second aspect of the present invention there is provided a method of operating a computer system to generate results simulating operation of a hardware system in a predetermined physical environment, the method comprising generating input bits satisfying a set of constraints representing restrictions on the physical environment; manipulating said input bits with a set of state bits according to a set of state transition functions to produce a set of outputs; and using said outputs to generate said results.

According to a third aspect of the present invention there is provided a method for proving the properties of a system comprising:

providing at least one constraint upon at least a subset of the inputs to the system;

deriving from the or each constraint a respective set of input relationships;

processing the input relationships to provide correction conditions for at least a first input;

providing a set of unconstrained inputs; and applying the correction conditions to said first inputs.

A standard representation for a deterministic system is as a Mealy machine. A Mealy machine is a sequential logic system in which the outputs are determined by both the inputs and a previously-stored state or states. Mealy machines may be formed by hardware arrangements of sequential logic circuitry and such arrangements can be represented by a state graph consisting of plural sets of state bits, each set of state bits being connected to a respective next sequential state by a transition function.

Although it would be possible to provide a physical Mealy machine having physical sequential logic circuitry, the preferred embodiment of the present invention provides a software model of a Mealy machine in which numbers are assigned to each of the state bits and to each input bit, transition functions, observation functions and initial states being set as binary decision diagrams over these variable numbers.

BRIEF DESCRIPTION OF THE FIGURES

An embodiment of the invention will now be described with reference to the accompanying drawings in which:

DESCRIPTION OF THE PREFERRED EMBODIMENT

Figure 1:
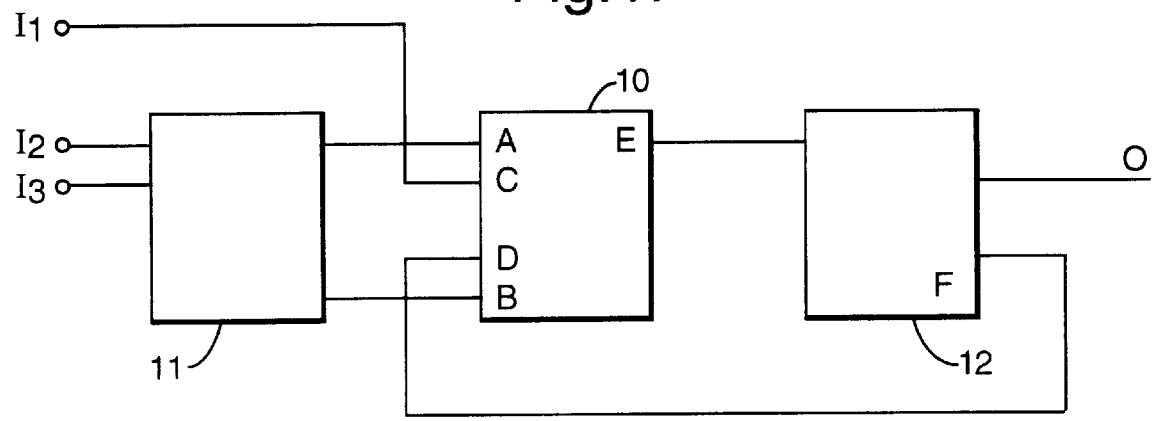
Figure 2:
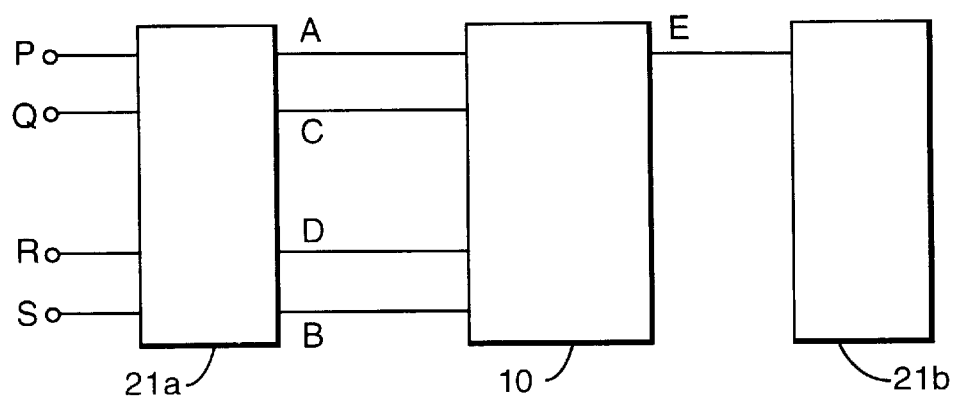

FIG. 1 is a diagram illustrating the application of the invention,

FIG. 2 is a diagram showing an environment and a circuit subject to the environment;

FIG. 3 shows a block diagram of the invention.

FIG. 1 shows a diagrammatic example for illustrating the application of the invention. FIG. 1 shows an arrangement of three circuit blocks (10, 11, 12), the arrangement having three inputs (I1, I2, I3) and an output (0). Circuit block (10) has four inputs (A, B, C, D) and an output (E). For the sake of example, the inputs A and B of circuit block (10) are provided by outputs of circuit block (11), itself having inputs (I2, I3). Input (C) of circuit block (10) is provided by a circuit input (I1) and input (D) of circuit block (10) is provided by an output (F) of circuit block (12), which circuit block receives an input from the output (E) of circuit block (10).

It would be possible to model the behaviour of the circuit block (10) entirely in isolation, but such a model may include conditions which do not occur in practical operation, due to the environment within which circuit block (10) resides. For example, the inputs A and C may be constrained by circuit block (11) to be always complementary, in which case operating the model for non-complementary A and C would not be useful.

Referring now to FIG. 2, the invention provides a model (21) of the environment of circuit block (10). The environment shown in FIG. 2 has two parts, the first part being the input environment (21A) and the second being the output environment (21B). In general, there will be an environment associated with the totality with the circuit block (10), but for simplicity only the input environment (21A) will be considered at present. The effect of the input environment (21A) is to impart such constraints upon a non-constrained set of inputs (P, Q, R, S) as would be necessary to simulate the inputs (A, B, C, D). For example, if the circuit block (11) were a flip flop, then the previously-discussed constraint upon the inputs (A, B) would exist, namely that these would be mutually complementary. If input (C) were a reset input then a constraint upon input (C) could be C=0 for normal operation to occur.

In FIG. 2, the environment model (21A) effects logical operation on the input (P) to provide the environment output (A) as input (10) and likewise effects logical operations on each of inputs (Q, R, S) to provide respective environment outputs (C, D, B) as inputs (C, D, B) to 10, such that no matter how or when the logic states of inputs P-S vary, the inputs to circuit block (10) are only those which could exist if the circuit block (10) were located as shown in FIG. 1.

The invention proposes that if a constraint (T) is given by

NOT I & T0+I & T1 where I is an input and neither T0 nor T1 depend on I, then I can be generated from a new input J which satisfies the relation

I=NOT J & NOT T0+J & T1.

In the example given above for the reset signal, there are two possible states of the input. The first state is C=RESET=1 and the second state is C=RESET=0. To satisfy the specified constraint that C=0 the first state does not exist and the second state always exists, thus (RESET=1)=0 and (RESET=0)=1. Thus, using the above relationship between I and J, for the case where C, represents the input to be constrained by "RESET =0" and Q is an unconstrained input described as J then the relationship between C and Q is given by:

C=Q & 0 +(NOT Q) & (NOT 1)

Turning to the other example above, the constraint is given by:

A=NOT B

In this case, assuming that the input B is directly provided by the input S so that B=S then it is necessary to constrain the signals applied to the input A regardless of the values of inputs P and S to satisfy the constraint above.

If A=1 then according to the constraint this can only occur when B (=S)=0. If A=0, this can only occur when B (=S)=1.

Thus the relationship may be reflected by the states (A=1, NOT B), (A=0, B).

Thus using the method of the invention:

A=P & (NOT S)+(NOT P) & (NOT S)

The method is to synthesise an environment from a Mealy machine with constraints and prove properties about the Mealy machine in that environment. The basic idea is to generate a set of inputs to the Mealy machine which are guaranteed to satisfy the constraints. If the constraint is A and it is equal to "!i & AO+AO+i & A1", where i is an input and neither AO nor A1 depend on i (the Shannon decomposition), then i is generated from a new input, j, by the equation "i=!j & !AO+j & A1". This equation for i does in fact satisfy the constraint (insofar as is possible) because:

A=!i & AO+i & A1

A=!(!j & !AO+j & A1) & AO+(!j & !AO+j & A1) & A1

A=(!j & AO+j & !A1) & AO+(!j & !AO+j & A1) & A1

A=!j & (AO+!AO & A1)+j & (AO & !A1+A1)

A=!j & (AO+A1)+j & (AO+A1)

A=AO+A1

This means that so long as there is a possible assignment to i which satisfies the constraint, then the equation for i is such an assignment. Equations for all the other inputs can be generated using the constraint "AO+A1".

As well as understanding that the equation for i satisfies the constraint, it must be ensured that all possible values of i are generated. Therefore, suppose that "r" is an assignment to all of the inputs which satisfies "A". If "r(i)=0", then we must have "r(AO)=1" (ie, "AO" evaluates to "1" under the assignments defined by "r") since "r(A)=1"; now, setting "r(j)=0", it is clear that the equation for i evaluates to 0. Similarly, if "r(i)=1" then "r(A1)=1" and if we set "r(j)=1" then the equation for i evaluates to 1.

Note that if the constraint complete determines i, ie "A1=!AO", then the equation for i reduces to "A1" and the input i will be completely eliminated from the description.

Referring to FIG. 3, constraints 50 are processed to provide correction functions 51 and these are applied to unconstrained input bits 52 to provide constrained input bits 53. Initial states 60 are used to set state bits 61 and these together with the constrained input bits are used as inputs to provide state transition functions 63 and observation functions 64.

One application is to modelling system invariants.

When a state diagram has one or more states which are residual in that the state or states are not accessible via normal state transitions, such invariant states can only be accessed by initialising the system into the residual state. If the environment obeys the constraints, the system must guarantee to maintain the residue. This however must be proved by using standard model—checking techniques. However once proved the state may be encoded using the above-mentioned environment synthesis technique using a new set of state bits to generate a set of signals which guarantee the state invariant. To prove that the new Mealy machine is sequentially equivalent to the original, the original state bits are added back to the observation function and under the assumption that the input and state observations of the two machines are equal, then the outputs and the next state observations are equal.

Thus there has been described a system for representing a physical environment and a method of operating a computer system to generate results simulating operation of a hardware system.

What is claimed is:

1. A system for representing a hardware device in a physical environment, wherein said hardware device has inputs and said physical environment imposes restrictions on said inputs, the system comprising:

a Mealy machine representation of said hardware device, said Mealy machine having inputs corresponding to said hardware device inputs and said Mealy machine implementing a set of state transition functions for manipulating input bits and state bits;

a first store for holding a set of state bits for said Mealy machine;

a second store for holding a set of input bits for said Mealy machine;

an input device for inputting a set of initial states of said state bits into said first store;

means for implementing a set of state transition functions for manipulating said input bits and said state bits; and means for providing input bits to said second store, said input bits satisfying a set of constraints representing said restrictions by the physical environment, wherein said means for providing input bits comprises means for providing unconstrained bits and means for constraining said unconstrained bits whereby said set of constraints is satisfied, wherein said means for constraining comprises means for transforming said set of constraints into a set of correction conditions and means for applying said correction conditions to said unconstrained bits.

2. A system as claimed in claim 1 further comprising means for generating a set of observation functions from said input bits and said state bits.

3. The system of claim 1, wherein each input bit has a true and a false value, and each constraint upon a respective input is represented by the logical sum of a first and a second term, the first term comprising the logical product of the true value of said input and a first expression, and the second term comprising the logical product of the false value of said input and a second expression, and:

wherein said means for transforming comprises means forming the logical inverse of said second expression, and wherein said means for applying logically sums the logical product of a true unconstrained bit and said first expression with the logical product of a false unconstrained bit and said inverse of said second expression.

4. The system of claim 1, wherein said Mealy machine is embodied as a software model.

5. A method of testing the performance of a hardware device in a predetermined physical environment, said environment imposing restrictions on inputs of said hardware device, the method comprising:

providing a computer system having a software model of a Mealy machine representative of said hardware device, said software model having inputs and outputs and being operative to manipulate input bits at said inputs with a set of state bits according to a set of state transition functions to produce said outputs, providing said input bits for said software model of said Mealy machine, said input bits satisfying a set of constraints representing said restrictions imposed by said physical environment;

operating said software model of said Mealy machine to provide outputs therefrom, and comparing said outputs with desired outputs of said hardware device in said environment;

wherein said providing step comprises providing a set of unconstrained bits and applying said constraints to said unconstrained bits;

wherein said step of applying said set of constraints comprises transforming said set of constraints into a set of correction conditions and applying said correction conditions to said unconstrained bits.

6. A method as claimed in claim 5 further comprising generating a set of observation functions independent on said input bits and said state bits.

7. A method as claimed in claim 5 wherein the hardware system comprises a portion of a hardware device and the physical environment is representative of at least a portion of the remainder of the hardware device.

8. The method of claim 5, wherein each input bit has a true and a false value, and each constraint upon a respective input is represented by the logical sum of a first and a second term, the first term comprising the logical product of the true value of said input and a first expression, and the second term comprising the logical product of the false value of said input and a second expression, and:

wherein said transforming step comprises forming the logical inverse of said second expression, and wherein said applying step comprises logically summing the logical product of a true unconstrained bit and said first expression with the logical product of a false unconstrained bit and said inverse of said second expression.

9. A method for proving the properties of a system having plural inputs, the method comprising:

determining at least one constraint upon at least one input to the system;

transforming said constraint into correction conditions by:
      deriving from the or each constraint a respective set of input relationships;
      processing the input relationships to provide said correction conditions;
      providing unconstrained input bits;
      applying the correction conditions to said unconstrained bits to thereby constrain said input;
      operating said system using said constrained input; and
      comparing the results of said operation with predicted properties of the system.

10. The method of claim 9, wherein said input has a true and a false value, and said constraint is represented by the logical sum of a first and a second term, the first term comprising the logical product of the true value of said input and a first expression, and the second term comprising the logical product of the false value of said input and a second expression, and:

wherein said processing step comprises forming the logical inverse of said second expression, and wherein said applying step comprises logically summing the logical product of a true unconstrained bit and said first expression with the logical product of a false unconstrained bit and said inverse of said second expression.

* * * * *